United States Patent [19]
Pitsch

[11] Patent Number: 5,852,377
[45] Date of Patent: Dec. 22, 1998

[54] RESET CIRCUIT FOR ENSURING PROPER RESET WHEN USED WITH DECAYING POWER SUPPLIES

[75] Inventor: Robert Alan Pitsch, Indianapolis, Ind.

[73] Assignee: Thomson Consumer Electronics, Inc., Indianapolis, Ind.

[21] Appl. No.: 748,888

[22] Filed: Nov. 14, 1996

Related U.S. Application Data

[60] Provisional application No. 60/009,178, Dec. 22, 1995.

[51] Int. Cl.⁶ .................................................. H03L 7/00
[52] U.S. Cl. ............................................. 327/143; 327/80
[58] Field of Search ................................... 327/142, 143, 327/80, 81, 584

[56] References Cited

U.S. PATENT DOCUMENTS

| | | | |
|---|---|---|---|
| 5,313,112 | 5/1994 | Macks | 307/296.3 |
| 5,686,848 | 11/1997 | Mes et al. | 327/143 |

FOREIGN PATENT DOCUMENTS

0486889A2  5/1992  European Pat. Off. .......... G06F 1/24

OTHER PUBLICATIONS

EDN Electrical Design News, May 27, 1993 "Discharger Prevents μp Latchup" By Derek Matsunaga.

Electronic Engineering Jun. 1960, pp. 25–26, "Cost Effective Reset Circuit".

*Primary Examiner*—Timothy P. Callahan
*Assistant Examiner*—Jeffrey Zweizig
*Attorney, Agent, or Firm*—Joseph S. Tripoli; Peter M. Emanuel; Robert D. Shedd

[57] ABSTRACT

An eletronic system includes a power supply providing an operating voltage, and a reset circuit. The reset circuit includes a voltage sensing circuit, coupled to the power supply, for generating a control signal when the operating voltage drops below a predetermined voltage. A control circuit generates a rest signal in response to the control signal. Further circuitry provides power to the control circuit, independently of the power supply, when the operating voltage drops below the predetermined voltage.

18 Claims, 1 Drawing Sheet

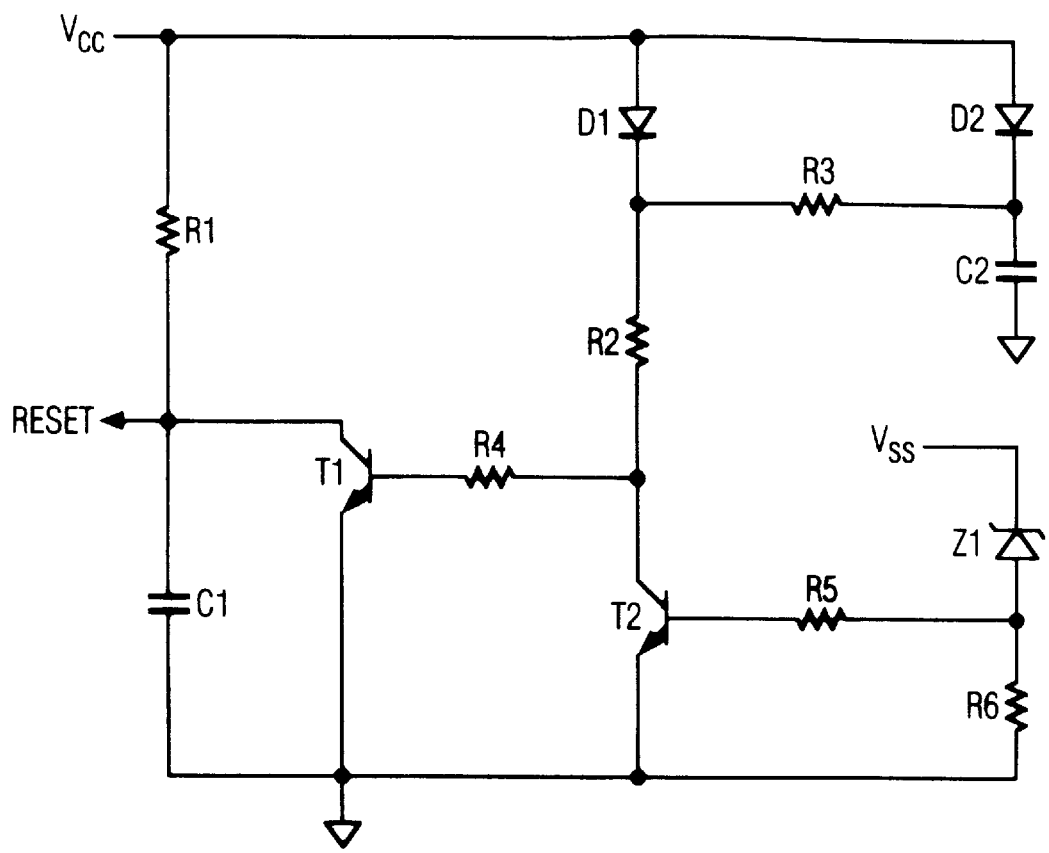

5,852,377

RESET CIRCUIT FOR ENSURING PROPER RESET WHEN USED WITH DECAYING POWER SUPPLIES

The present U.S. patent application is a non-provisional patent application filed on Nov. 14, 1996 under 35 U.S.C. §111(a) which, pursuant to 35 U.S.C. §119(e)(1), claims the benefit of the filing date of U.S. provisional patent application Ser. No. 60/009,178 filed on Dec. 22, 1995 under 35 U.S.C. §111(b).

The present invention relates to a reset circuit for use in electronic equipment, and in particular, to a reset circuit which operates properly in the presence of a slowly decaying power supply during power off sequencing.

DESCRIPTION OF THE PRIOR ART

Electronic equipment, such as a microprocessor, operate properly only when the voltage of their operating power supply is greater than a predefined minimum operating voltage. If the power supply voltage should drop below this voltage, the operation of the equipment becomes undefined, and erratic. If, for instance, a microprocessor is allowed to continue running under these conditions, it may perform operations which will damage the system in which the microprocessor is installed.

In order to prevent erratic operation caused by a power supply voltage below the minimum operating voltage, existing reset circuitry monitors the power supply voltage, and generates a reset signal when the power supply voltage drops below a predetermined trigger voltage. This reset signal is supplied to the electronic equipment (i.e. microprocessor), and conditions it to cease operation and enter a quiescent state.

In general, the reset signal is a signal which is at ground potential during the reset period, and at the power supply voltage otherwise. Prior art reset signal generators comprise a voltage sensing network, and a semiconductor switch coupled between the reset signal terminal and ground. This switch is activated during reset periods, thereby coupling the reset signal terminal to ground.

When a power interruption occurs, the voltage sensing network senses that the power supply voltage has dropped below the trigger voltage, and conditions the semiconductor switch to close, thus, generating the reset signal. The reset signal conditions the electronic equipment to enter the quiescent state before the power supply voltage drops below that equipment's minimum operating voltage. This reset signal is ideally maintained until the power supply voltage reaches zero, and further operation of the electronic equipment is impossible.

Normally, when a power interruption occurs, the power supply voltage drops relatively rapidly. Prior art reset circuits operate properly under these conditions. However, it is possible for the voltage of the power supplies to decay relatively slowly during a power interruption due to their design, the filter capacitance, and/or their loading.

Under these conditions, the voltage sensing network and semiconductor switch will generate the reset signal properly at the desired voltage, as above. However, the voltage sensing network may cease to operate reliably as the power supply voltage slowly continues to drop. For example, as the power supply voltage drops slowly, the activation of the semiconductor switch may cause the voltage on the reset capacitor to rebuild, or a charge path to the decaying power supply can condition the voltage sensing network to, erroneously, remove the reset signal. Similarly, when the reset signal is generated, it conditions the electronic system to enter a quiescent state. This, in turn, causes a decrease in the current drawn from the power supply, and, therefore, a slight rise in the power supply voltage.

In either or both of these conditions, the semiconductor switch generating the reset signal may be released before the power supply voltage decays to zero, when all operation of the electronic equipment ceases. The reset signal begins to rise toward VCC and the electronic equipment may leave the quiescent state. This in turn may allow the electronic equipment to enter an unknown state from which it may not start properly at the next reapplication of power, or it may operate erratically causing damage to the system in which it is used.

A reset signal generating circuit which operates properly in the presence of a slowly decaying power supply voltage is desirable.

BRIEF SUMMARY OF THE INVENTION

In accordance with principles of the present invention, an electronic system includes a power supply providing an operating voltage, and a reset circuit. The reset circuit includes a voltage sensing circuit, coupled to the power supply, for generating a control signal when the operating voltage drops below a predetermined voltage. A control circuit generates a reset signal in response to the control signal. Further circuitry provides power to the control circuit, independently of the power supply, when the operating voltage drops below the predetermined voltage.

BRIEF DESCRIPTION OF THE DRAWINGS

In the drawing

The Figure is a schematic diagram illustrating a reset signal generator according to the present invention.

DETAILED DESCRIPTION

In the Figure, a main power supply (not shown) produces a main power supply voltage, VSS. In the illustrated embodiment, the main power supply voltage is 21.2 volts. From the main power supply, an operating voltage, VCC, for electronic equipment (also not shown) in the system, is derived. In the illustrated embodiment, the operating voltage is 5 volts. As is generally the case, so long as the main power supply voltage VSS remains above a trigger voltage (described in more detail below) the operating voltage VCC for the electronic equipment will remain relatively constant.

The source (not shown) of the electronic equipment operating voltage, VCC, is coupled to a first electrode of a first resistor R1, and to respective anodes of a first diode D1 and a second diode D2. A second electrode of the first resistor R1 is coupled to the reset signal output terminal, RESET, a collector electrode of a first NPN transistor T1, and a first electrode of a first capacitor C1. The reset signal output terminal, RESET, is coupled to respective reset signal input terminals of devices in electronic equipment (not shown), which may, for example, include a microprocessor. A second electrode of the capacitor C1 is coupled to a source of a reference potential (ground). The emitter electrode of the first NPN transistor T1 is also coupled to ground.

A cathode of the first diode D1 is coupled to respective first electrodes of a second resistor R2 and a third resistor R3. A second electrode of the second resistor R2 is coupled to a first electrode of a fourth resistor R4 and a collector electrode of a second NPN transistor T2. A second electrode of the fourth resistor R4 is coupled to the base electrode of the first NPN transistor T1. An emitter electrode of the second NPN transistor T2 is coupled to ground. A cathode of the second diode D2 is coupled to a second electrode of the third resistor R3 and a first electrode of a second capacitor C2. A second electrode of the second capacitor C2 is coupled to ground.

The main power supply (not shown), producing the main power supply voltage VSS (from which the electronic equipment operating voltage VCC is derived), is coupled to a cathode of a Zener diode Z1. An anode of the Zener diode Z1 is coupled to respective first electrodes of a fifth resistor R5 and a sixth resistor R6. A second electrode of the fifth resistor R5 is coupled to a base electrode of the second NPN transistor T2. A second electrode of the sixth resistor R6 is coupled to ground.

In the description, below, of the operation of the circuit illustrated in the Figure the various junction voltages of the first and second NPN transistors, T1 and T2, respectively, are ignored, unless explicitly referred to. These transistors are standard NPN transistors, and one skilled in the art will understand what the nominal junction voltages are for the various operating conditions described below, and will be able to compensate for these voltages appropriately during the design of such a circuit.

In operation, the first resistor R1 and the first capacitor C1 cooperate to generate a reset signal at the reset signal output terminal, RESET, on power-up in a known manner. The remainder of the circuit illustrated in the Figure monitors the main power supply VSS and generates a reset signal at the reset signal output terminal, RESET, when the voltage of the main power supply VSS falls lower than a trigger voltage which is higher than the voltage at which the electronic equipment operating voltage, VCC, begins to drop.

Initially both the main power supply (VSS) and the electronic equipment operational power supply (VCC) are at full voltage: e.g. 21.2 volts and 5 volts, respectively. In this condition, the combination of the Zener diode Z1 and the sixth resistor R6 produce a substantially constant voltage drop across the Zener diode Z1 in a known manner. In a preferred embodiment, the Zener diode Z1 is a 9.1 volt zener diode, and the constant voltage drop across the Zener diode Z1, thus, is 9.1 volts. The voltage across the sixth resistor R6, therefore, is 12.1 volts. The second NPN transistor T2, therefore, is on, and the voltage at the junction of the second resistor R2 and the fourth resistor R4 is zero. The first NPN transistor T1, therefore, is off.

The voltage across the capacitor C1 is charged to +5 volts through resistor R1, and the signal at the reset signal output terminal is +5 volts, indicating that the reset signal is not asserted. The first diode D1 is on, and 5 volts is dropped across the second resistor R2. The second capacitor C2 is charged to 5 volts through the second diode D2, which is off. There is no current flowing through the third resistor R3 because the voltage is the same at both of its electrodes. In summary, in the normal operating condition of the circuit illustrated in the Figure, the first NPN transistor T1 is off, the second NPN transistor T2 is on, and both capacitors C1 and C2 are charged to 5 volts.

If a power interruption occurs, the main power supply voltage, VSS, begins to drop. As described above, so long as the main power supply voltage VSS is above a known minimum voltage, the electronic equipment operating voltage VCC remains relatively constant. It is assumed the voltages drop relatively slowly in the present example. So long as the voltage on the VSS power supply remains above 9.8 volts (9.1 volts across the Zener diode Z1 plus 0.7 volt base-emitter junction voltage on the second NPN transistor T2), the circuit remains in the condition described above. When the voltage on the VSS power supply drops to 9.8 volts from 21.2 volts, the Zener diode Z1 turns off, and the voltage at the base electrode of the second NPN transistor T2 is pulled to zero via the fifth and sixth resistors, R5 and R6, respectively. The second NPN transistor T2, thus, turns off. This, in turn, allows the voltage at base electrode of the first NPN transistor T1 to be pulled up via the second, third and fourth resistors, R2, R3 and R4, respectively. The NPN transistor T1, thus, turns on. This connects the reset signal output terminal, RESET, to ground, generating a reset signal.

Thus, the reset signal is generated at the reset signal output terminal, RESET, before the main power supply voltage VSS drops to the voltage at which the electronic equipment power supply voltage, VCC, begins to drop. When the voltage, VCC, at the electronic equipment operational power supply does begin to drop, the second capacitor C2 retains it's voltage, and the second diode D2 turns off. The third resistor R3 is relatively large, much larger than the sum of the second and fourth resistors. Thus, the voltage at the junction of the second and third resistors, R2 and R3, respectively, which would be present at that junction due to the voltage divider action on the voltage on the second capacitor C2 is relatively low. So long as the voltage, VCC, at the electronic equipment operational power supply remains above this voltage, the first diode D1 remains on, pulling the voltage at that junction to the voltage, VCC, at the electronic equipment operational power supply. During this time, the first NPN transistor T1 remains on, and the second capacitor C2 discharges slowly through the third resistor R3 toward the current voltage at the VCC power supply, minus the 0.7 volt diode voltage drop across the first diode D1.

When the voltage, VCC, at the electronic equipment operational power supply drops below the voltage divider voltage (described above) at the junction of the second and third resistors, R2 and R3, respectively, the first diode D1 turns off, isolating the reset circuitry from the decaying electronic equipment operational power supply (VCC). The voltage at the base electrode of the first NPN transistor T1 is pulled up to the voltage on the second capacitor C2 through the second, third and fourth resistors, R2, R3 and R4, respectively. During this time, the second capacitor C2 discharges through the third, second and fourth resistors, R3, R2 and R4, respectively, and the base-emitter junction of the first NPN transistor T1. The current will be relatively low, and the values of the second capacitor C2 and the second, third, and fourth resistors, R2, R3, and R4, respectively, can be selected so that the second capacitor C2 will retain sufficient charge to maintain the first NPN transistor T1 on for a long enough duration that all power supplies can decay to zero, where no further operation of the electronic equipment is possible, regardless of how slow the voltage at the VCC power supply is decaying.

The power supply in the illustrated embodiment provides two voltages, one of which provides power to the electronic equipment and the reset circuit, and the other one of which is monitored. One skilled in the art will understand that this invention may also be used in a system including only a single power supply voltage, which is both monitored and used to provide power to the electronic equipment and the reset circuit. Also, the transistors in the illustrated embodiment are bipolar NPN transistors. One skilled in the art will understand that other types of transistors, such as FETs, etc., may also be used, and will understand how to couple the control electrodes, corresponding to the gate electrodes in the illustrated NPN transistors, and the main conduction paths, corresponding to the collector-emitter paths in the illustrated NPN transistors, in the proper manner, to provide the same functions as illustrated in the Figure.

A reset circuit as illustrated in the Figure will maintain a reset signal at the reset signal output terminal, RESET, reliably for a time sufficient for all power supplies to decay to zero, regardless of how slowly the power supply voltages decay.

What is claimed is:

1. A reset circuit, comprising:

a power supply for providing a main power supply voltage and for providing an operating voltage;

voltage sensing circuitry, coupled to the power supply, for generating a control signal in response to the main power supply voltage dropping below a predetermined voltage;

a control circuit for generating a reset signal in response to the control signal; and circuitry for providing power to the control circuit in response to the operating voltage dropping below a further predetermined voltage.

2. The system of claim 1 wherein the power providing circuitry comprises circuitry for providing power to the control circuit for as long as it takes the operating voltage to reach substantially zero volts during a power interruption.

3. The system of claim 1 wherein the control circuit comprises a first transistor having a control electrode responsive to the control signal, one end of a main conductive path coupled to a source of a reference potential, and the other end of the main conductive path producing the reset signal.

4. The system of claim 3 wherein the control electrode of the transistor is further coupled to the power providing circuitry.

5. The system of claim 3 wherein the voltage sensing circuitry comprises:

a second transistor having a main conductive path coupled between the control electrode of the first transistor and the source of reference potential; and circuitry for conditioning the second transistor to turn off in response to the operating voltage dropping below the predetermined voltage, and turn on otherwise.

6. The system of claim 5 wherein the second transistor conditioning circuitry comprises the serial connection of a Zener diode and a resistor coupled between the power supply and a source of reference potential.

7. The system of claim 5 wherein the second transistor comprises a control electrode coupled to the second transistor conditioning circuitry.

8. The system of claim 5 wherein the power providing circuitry comprises:

a voltage storage device coupled to the control electrode of the first transistor; and circuitry, coupled between the power supply and the voltage storage device, for providing operating voltage to the voltage storage device while the operating voltage is above the predetermined voltage.

9. The system of claim 8 wherein the voltage storage device comprises a capacitor.

10. The system of claim 8 wherein the operating voltage providing circuitry comprises a diode coupled between the power supply and the voltage storage device.

11. The system of claim 8 wherein the power providing circuitry further comprises a resistor coupled between the voltage storage device and the control electrode of the first transistor.

12. The system of claim 1 wherein the voltage sensing circuitry comprises:

a transistor; and circuitry for conditioning the transistor to turn off in response to the operating voltage dropping below the predetermined voltage, and turn on otherwise.

13. The system of claim 12 wherein the transistor conditioning circuitry comprises the serial connection of a Zener diode and a resistor coupled between the power supply and a source of reference potential.

14. The system of claim 12 wherein the transistor comprises a control electrode coupled to the transistor conditioning circuitry, one end of a main conductive path coupled to a source of reference potential, and the other end of the main conductive path producing the control signal.

15. The system of claim 1 wherein the power providing circuitry comprises:

a voltage storage device coupled to the control circuit; and circuitry, coupled between the power supply and the voltage storage device, for providing operating voltage to the voltage storage device while the operating voltage is above the predetermined voltage.

16. The system of claim 15 wherein the voltage storage device comprises a capacitor.

17. The system of claim 15 wherein the circuitry for providing operating voltage to the voltage storage device comprises a diode coupled between the power supply and the voltage storage device.

18. In a system including: electronic equipment; a main power supply providing a main voltage; and a source of an operational voltage derived from the main power supply for the electronic equipment, the operational voltage remaining relatively constant while the main voltage remains above a predetermined minimum voltage; a reset circuit comprising:

voltage sensing circuitry for generating a control signal in response to the main voltage dropping below a predetermined trigger voltage which is above the predetermined minimum voltage;

a control circuit, for generating a reset signal in response to the control signal; and circuitry, coupled to the operational voltage source, for providing power to the control circuit independently of the main power supply in response to the operational voltage dropping below the predetermined minimum voltage; the control circuit being responsive to the power from the power providing circuitry for continuing to generate the reset signal until the operational voltage drops to substantially zero volts during a power interruption.

* * * * *